United States Patent
Conley (10) Patent No.: US 7,640,424 B2
(45) Date of Patent: Dec. 29, 2009

(54) INITIALIZATION OF FLASH STORAGE VIA AN EMBEDDED CONTROLLER

(75) Inventor: Kevin M. Conley, San Jose, TX (US)

(73) Assignee: SanDisk Corporation, Sunnyvale, CA (US)

( * ) Notice: Subject to any disclaimer, the term of this patent is extended or adjusted under 35 U.S.C. 154(b) by 436 days.

(21) Appl. No.: 11/250,094

(22) Filed: Oct. 13, 2005

(65) Prior Publication Data

US 2007/0088940 A1 Apr. 19, 2007

(51) Int. Cl.
- G06F 9/00 (2006.01)
- G06F 9/24 (2006.01)
- G06F 15/177 (2006.01)
- G06F 3/00 (2006.01)
- G06F 13/00 (2006.01)

(52) U.S. Cl. .............................. 713/1; 713/2; 713/100; 709/222; 710/10; 711/170

(58) Field of Classification Search ...................... 713/1, 713/2, 100; 709/222; 710/10; 711/170
See application file for complete search history.

(56) References Cited

U.S. PATENT DOCUMENTS

| | | | |
|---|---|---|---|
| 5,172,338 A | 12/1992 | Mehrotra et al. | |
| 5,175,831 A | 12/1992 | Kumar | |
| 5,200,959 A | 4/1993 | Gross et al. | |
| 5,270,979 A | 12/1993 | Harari et al. | |
| 5,315,541 A | 5/1994 | Harari et al. | |
| 5,428,621 A | 6/1995 | Mehrotra et al. | |
| 5,430,859 A | 7/1995 | Norman et al. | |
| 5,532,962 A | 7/1996 | Auclair et al. | |
| 5,602,987 A | 2/1997 | Harari et al. | |
| 5,663,901 A | 9/1997 | Wallace et al. | |
| 5,712,180 A | 1/1998 | Guterman et al. | |
| 5,884,074 A | * 3/1999 | Maeda et al. | ................... 713/2 |
| 6,009,496 A | 12/1999 | Tsai | |
| 6,151,248 A | 11/2000 | Harari et al. | |
| 6,222,762 B1 | 4/2001 | Guterman et al. | |
| 6,247,084 B1 | 6/2001 | Apostol, Jr. | |
| 6,286,097 B1 | 9/2001 | Chang et al. | |
| 6,426,893 B1 | 7/2002 | Conley et al. | |

(Continued)

FOREIGN PATENT DOCUMENTS

WO  WO 0244892  6/2002

OTHER PUBLICATIONS

Written Opinion of the International Searching Authority of related International application No. PCT/US2006/040239.

Primary Examiner—Chun Cao
Assistant Examiner—Stefan Stoynov
(74) Attorney, Agent, or Firm—Brinks Hofer Gilson & Lione (57) ABSTRACT

A digital system including flash memory, coupled to a system-on-a-chip within which a flash memory subsystem controller is embedded, is disclosed. The system-on-a-chip includes support for a standard external interface, such as a Universal Serial Bus (USB) or IEEE 1394 interface, to which a host system such as flash memory test equipment can connect. Initialization of the flash memory is effected by opening a communications channel between the host system and the embedded flash memory subsystem controller. The host system can then effect initialization of the flash memory subsystem, including formatting of the flash memory arrays, loading application programs, and the like, over the communications channel.

21 Claims, 5 Drawing Sheets

U.S. PATENT DOCUMENTS

| | | |
|---|---|---|
| 6,434,697 B1 | 8/2002 | Leyda et al. |
| 6,487,655 B1 | 11/2002 | Wildgrube et al. |
| 6,523,083 B1 * | 2/2003 | Lin et al. .................... 711/103 |
| 6,658,633 B2 | 12/2003 | Devins et al. |
| 6,829,672 B1 | 12/2004 | Deng et al. |
| 6,859,856 B2 | 2/2005 | Piau et al. |
| 6,877,063 B1 | 4/2005 | Allegrucci et al. |
| 6,920,553 B1 | 7/2005 | Poisner |
| 2003/0005278 A1 | 1/2003 | Deng et al. |
| 2003/0172261 A1 | 9/2003 | Lee et al. |
| 2003/0217254 A1 | 11/2003 | Page et al. |
| 2004/0139307 A1 | 7/2004 | Barnett |
| 2005/0015582 A1 | 1/2005 | Shida et al. |
| 2005/0144361 A1 | 6/2005 | Gonzalez et al. |
| 2006/0041712 A1 * | 2/2006 | Sun et al. .................... 711/103 |

* cited by examiner

PRIOR ART

INITIALIZATION OF FLASH STORAGE VIA AN EMBEDDED CONTROLLER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of flash memory systems, and is more specifically directed to the initialization of flash memory as used for integrated digital systems.

The popularity of the non-volatile solid-state memory technology that is commonly referred to as "flash" memory has greatly increased in recent years. Flash memory typically refers to electrically-erasable semiconductor memory that can be erased and rewritten in relatively small blocks, rather than on a chip-wide basis, or in relatively large blocks as in conventional EEPROM devices. Flash memory has become especially popular for applications in which non-volatility (i.e., data retention after removal of power) of the stored data is essential, but in which the frequency of rewriting is relatively low. Examples of popular applications of flash memory include portable audio players, "SIM" card storage of telephone numbers and phone activity in cellular telephone handsets, "thumbkey" removable storage devices for computers and workstations, storage devices for digital cameras, and the like.

Typical conventional flash memory products are effectively arranged as "chipsets" consisting of one or more integrated circuits that include the flash memory storage resource in the form of one or more devices (or "arrays"), and an integrated circuit that serves as the memory controller for the flash memory product. The flash memory array may be arranged as so-called NOR flash memory, in which individual memory cells may be randomly accessed, or so-called NAND flash memory, in which sequential access of a page or block of memory is necessitated. As known in the art, each of these flash memory arrangements has advantages and disadvantages. For example, NOR flash memory is especially advantageous for small capacity code storage, while NAND flash memory is especially useful for high capacity data storage such as for audio players and digital cameras. In recent years, the use of multi-level cell (MLC) flash memory, in which each flash memory cell can store a multi-bit data value (typically a two bit value, stored as one of four possible states), has become popular, especially in NAND flash memory.

Figure 1:
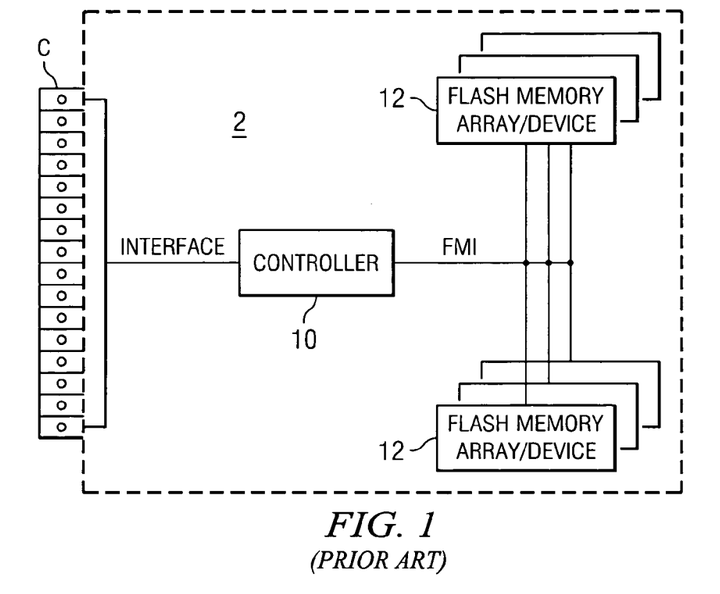
FIG. 1 is an electrical diagram, in block form, of a conventional flash memory subsystem.

According to one typical arrangement, flash memory is manufactured and sold as a flash memory subsystem containing the flash memory resources and the subsystem controller mounted onto a card. Examples of such subsystems included the well-known COMPACT FLASH (CF) cards, Secure Digital (SD) cards, and MULTIMEDIA cards. FIG. 1 illustrates an exemplary conventional flash memory system 2, in block diagram form. In this arrangement, multiple flash memory devices ("arrays") 12 are connected to subsystem controller 10 by way of flash media interface FMI, which is typically a bus that communicates physical address signals and control signals from subsystem controller 10, and that bidirectionally communicates data to and from devices 12. Subsystem controller 10 is connected by way of interface bus IF to connector C. As is well known in the art, flash memory system 2 can be inserted into or otherwise connected to a host device, such as a camera, computer, audio player, and the like by way of connector C. Connector C and interface bus IF are arranged according to the particular standard according to which flash memory system 2 is constructed and realized (e.g., as a CF card, an SD card, or a MULTIMEDIA card).

In other known arrangements (e.g., SMART MEDIA cards), the flash memory systems do not include a subsystem controller. In such arrangements, referring to FIG. 1 by way of analogy, flash media interface FMI connects to a controller located externally from the flash memory system, for example a controller that is included in the host device (e.g., camera) utilizing the flash memory.

Typically, conventional flash memory arrays are not formatted or initialized (beyond, perhaps, the marking of defective blocks established at the chip test level) until after their assembly into a card. Flash memory initialization typically includes such functions as formatting the arrays according to a file system, generating defect maps so that physically defective memory locations are avoided in use, low-level user area formatting of the memory arrays, loading a disk image of application software that may be executed by a system using the flash memory system and, for those systems in which the subsystem controller is implemented, downloading firmware and operating parameters, trimming local oscillator frequencies, and the like. The result of the initialization process is a flash memory system in which data can be written and read at physical locations corresponding to a logical address from the host system. In addition, it is contemplated that the configuration of the flash memory system can also be updated during operation, should a portion of the physical memory become defective, or if additional disk image data is to be stored for add-on applications.

Figure 2:
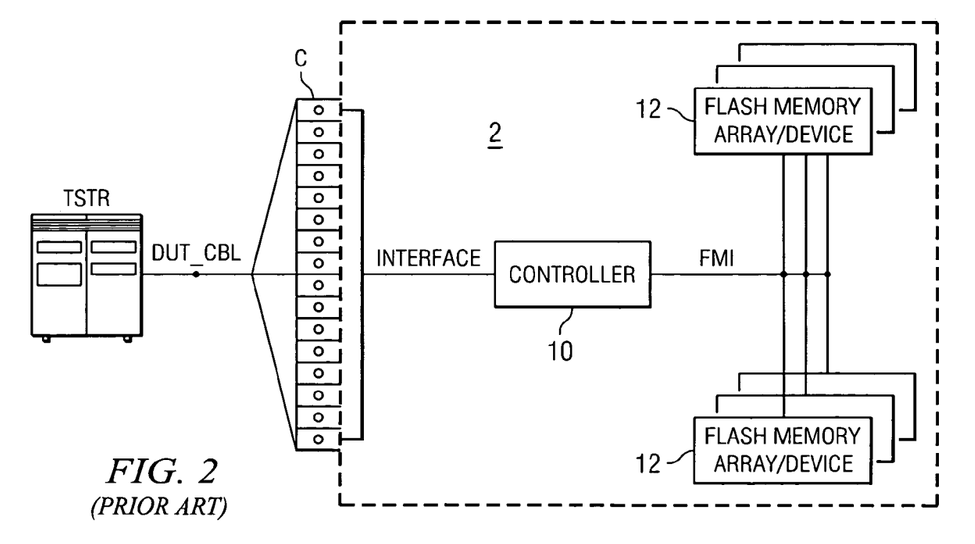
FIG. 2 is an electrical diagram, in block form, of a conventional system for initializing the flash memory subsystem of FIG. 1.

Generally, the initialization of flash memory resources is typically performed by the flash memory system manufacturer, typically after flash memory devices 12 and subsystem controller 10 are mounted to the ultimate system board and thus interconnected, in the conventional manner. As shown in FIG. 2, by way of example, after its manufacture, flash memory system 2 is connected to tester TSTR via connector C and a test cable DUT_CBL. Tester TSTR will communicate with flash memory system 2 over test cable DUT_CBL and connector C, to ensure continuity of the electrical connections in flash memory system 2, to ensure proper DC behavior of the terminals of connector C, and to perform certain rudimentary functional tests as can be executed prior to initialization of flash memory devices 12. In addition, as known in the art, tester TSTR typically can apply diagnostic commands to flash memory system 2, specifically to controller 10, for testing the functionality of flash memory system 2 including its flash memory devices 12, and for initializing flash memory system 2. As mentioned above, conventional initialization of flash memory system 2 includes formatting and configuring the flash memory resources of flash memory devices 12, detecting and logging physically defective memory locations of flash memory devices 12, loading a control program ("firmware") into controller 10 (e.g., into NOR flash memory embedded within controller 10), and loading application software, in the form of DOS or disk images into flash memory devices 12, as suitable for use in the intended application. Examples of such application software include data encryption software, wear leveling algorithms, and the like that can be executed by controller 10.

Figure 3:
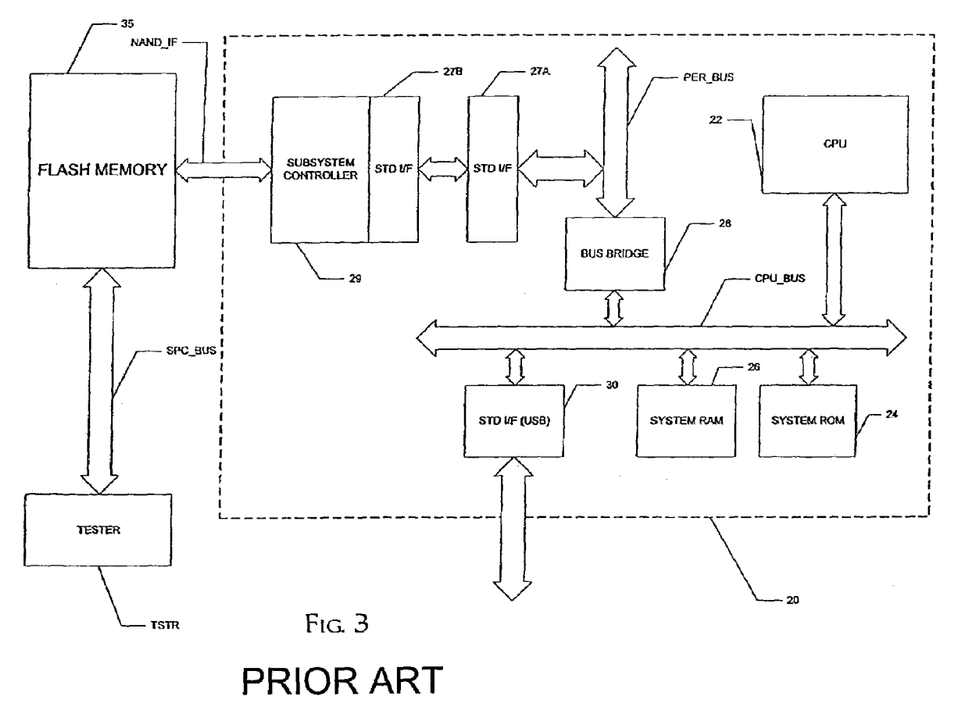
FIG. 3 is an electrical diagram, in block form, of a conjectured system-on-a-chip (SOC) utilizing flash memory, and including a conventional and undesirable manner of initializing the flash memory.

Recently, however, flash memory storage has become desirable for use in connection with many new applications, including those which are controlled by a so-called "systemon-a-chip", or "SOC". In these contemplated SOC applications, a single integrated circuit integrates the central processing unit (CPU), its system memory (RAM and ROM), standard interface functions (e.g., USB, serial I/O, etc.), and other peripherals useful in the system. As presently configured, an SOC architecture for a consumer device that uses flash memory, in order to take advantage of its non-volatile rewritable storage features, would also integrate the flash memory subsystem controller into the SOC, with an external interface from the SOC to the flash memory devices. FIG. 3 illustrates such a conventional arrangement of an SOC-based architecture using flash memory, as will now be described.

As shown in FIG. 3, SOC 20 interfaces with flash memory 35, typically arranged as one or more NAND flash memory devices (although, of course, NOR flash memory may instead be used) by way of conventional flash memory interface NAND_IF. In this arrangement, flash memory subsystem controller 29 is realized within SOC 20, rather than as part of a flash memory subsystem as described above in FIG. 1. SOC 20 is indeed a system-on-a-chip, and as such includes CPU 22 and various system functions such as system ROM 24, system RAM 26, and standard interfaces 30 (e.g., USB, SCSI, RS-232, or other interfaces) to which CPU 22 is connected by way of a conventional bus CPU_BUS as shown in FIG. 3. Other peripherals may also be included within SOC 20, and communicate with CPU 22 via bus bridge 28 and peripheral bus PER_BUS. One such peripheral, in the example of FIG. 3, is subsystem controller 29, which is coupled to peripheral bus PER_BUS by way of standard interfaces 27A, 27B that translate signals between peripheral bus PER_BUS and subsystem controller 29; this translation enable a conventional subsystem controller 29 to be readily implemented within SOC 29 without requiring wholesale redesign. As such, SOC 22 can readily operate in a manner that uses flash memory 35 as non-volatile storage, analogous to disk storage. For example, bulk data storage may be maintained on flash memory 35, as can application programs. For example, application programs stored on flash memory 35 can be loaded via subsystem controller 29 (and buses PER_BUS, CPU_BUS and the various interfaces and bridges) into system RAM 26 for execution by CPU 22, in much the same manner as an application program is called and loaded from disk storage in a larger system. Similarly, data can be stored and accessed by CPU 22 from flash memory 35 by way of subsystem controller 29.

Unfortunately, conventional initialization methodologies cannot readily initialize flash memory 35 in this configuration, in which subsystem controller 29 is separated from flash memory and is embodied within SOC 20. In particular, certain portions of flash memory 35 are not accessible except by way of a corresponding subsystem controller (such as subsystem controller 29), and it is these "system" portions of flash memory 35 that are involved in the initialization process. Prior to initialization, however, in the conventional SOC arrangement of FIG. 3, subsystem controller 29 is not accessible for initialization of flash memory 35. FIG. 3 illustrates a brute force approach, as conjectured in connection with this invention, to the initialization of flash memory 35 in an SOC configuration, by way of which tester TSTR connects to a specially designed interface of flash memory 35, via special bus SPC_BUS, and executes diagnostic commands via this interface to effect initialization. However, this conjectured approach requires the creation of special test hardware (tester TSTR and special bus SPC_BUS), as well as creation of the special interface into flash memory 35, both of which would add substantial cost to the manufacture and production of the system, and would limit the flexibility with which the system may be configured and initialized.

By way of further background, U.S. Pat. No. 6,009,496 describes a microcontroller architecture with embedded flash memory, in which an on-board microprocessor executes a reprogramming control routine, stored in on-board read-only memory, to reprogram the embedded flash memory. This U.S. Pat. No. 6,009,496 also discloses that the microcontroller system can be manually set into this reprogramming mode when newly fabricated, in which case the microprocessor executes the reprogramming control routine from the on-board ROM to program the embedded flash memory with data received over an external interface.

BRIEF SUMMARY OF THE INVENTION

It is therefore an object of this invention to provide a method and system for initializing flash memory subsystems for system-on-a-chip (SOC) type systems having integrated flash memory subsystem controllers.

It is a further object of this invention to provide such a method and system that can utilize conventional test hardware for such initialization.

It is a further object of this invention to provide such a method and system in which the SOC hardware need not be radically rearranged to provide such initialization.

Other objects and advantages of this invention will be apparent to those of ordinary skill in the art having reference to the following specification together with its drawings.

The present invention may be implemented into a system-on-a-chip (SOC) architecture in which a standard external interface of the SOC is made accessible to external test hardware. An executable initialization program that is either downloaded from the external test hardware into the system memory of the SOC or already present in system ROM will, upon execution by the CPU, open a communication channel between the external test hardware and a flash memory subsystem controller in the SOC. This communication channel enables the external test hardware to effect initialization of flash memory via the subsystem controller, preparing the flash memory for use by the SOC, loading SOC application programs onto the flash memory, and the like.

DETAILED DESCRIPTION OF THE INVENTION

The present invention will be described in connection with its preferred embodiment, namely as implemented into a system and method that utilizes test hardware to initialize flash memory for use by a system-on-a-chip (SOC) that includes the flash memory subsystem controller, such as a digital audio player (DAP). This particular exemplary implementation of the invention is selected because it is contemplated that this invention will be particularly beneficial when utilized in such an arrangement. However, it is also contemplated that the benefits of this invention may also apply to other architectures and implementations of flash memory systems. Accordingly, it is to be understood that the following description is provided by way of example only, and is not intended to limit the true scope of this invention as claimed.

Figure 4:
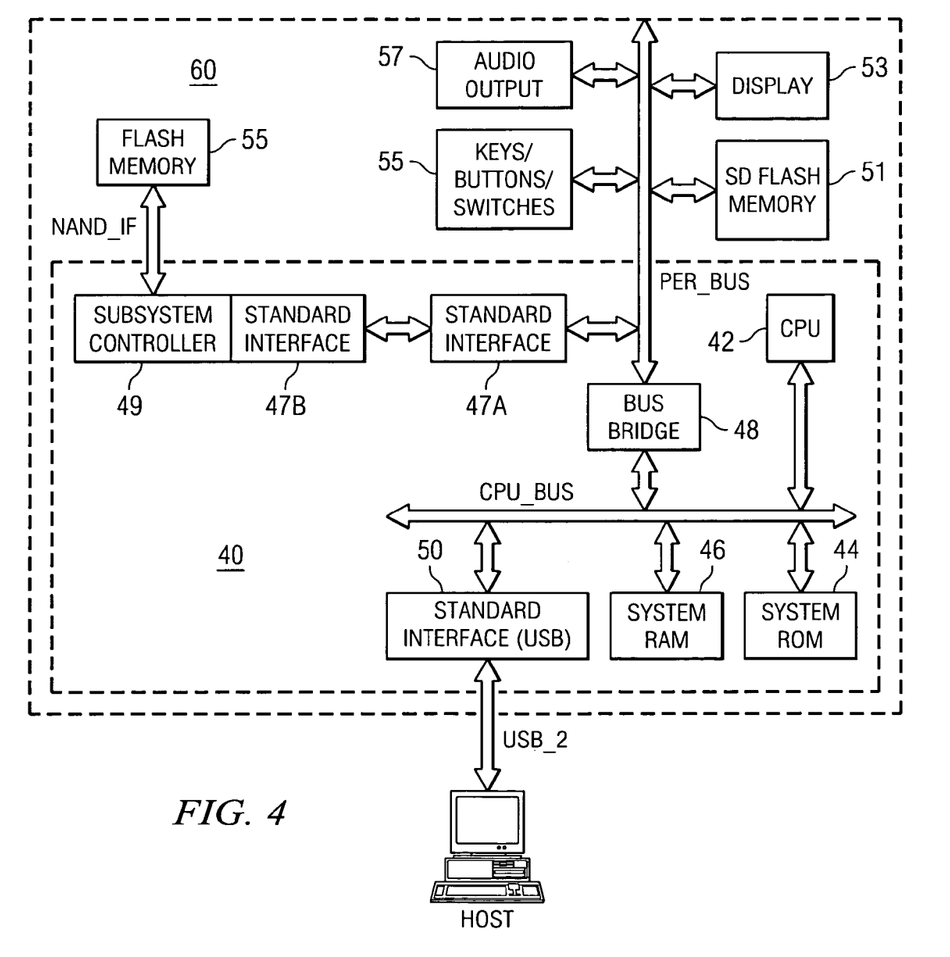
FIG. 4 is an electrical diagram, in block form, of a digital system constructed according to a system-on-a-chip (SOC) architecture, and utilizing flash memory, according to the preferred embodiment of the invention, including resources for initializing of the flash memory.

FIG. 4 illustrates an exemplary implementation of the preferred embodiment of the invention, with reference to digital system 60. System 60 in this example corresponds to a digital audio player (DAP), given the particular peripherals that it includes. Of course, those skilled in the art having reference to this specification will readily recognize that system 60 may be intended for any one of a number of functions, primarily determined by the system software that it executes and the arrangement of its peripherals. Examples of such other digital systems includes communications systems such as wireless telephone handsets, wireless email systems (e.g., BLACKBERRY devices), digital audio recorders, electronic calculators, handheld computing systems (i.e., "palmtop" devices) such as useful in inventory control or delivery businesses, and the like. According to the preferred embodiment of the invention, digital system 60 is based on system-on-a-chip ("SOC") 40, which embodies substantially all basic system functions within a single integrated circuit. SOC 40, in this example, includes central processing unit (CPU) 42, which is the main computing component of digital system 60. CPU 42 is preferably a general purpose or application-specific microprocessor or microcomputer that operates by way of executing software instructions, for example as stored in system ROM 44, system RAM 46 (once SOC 40 is booted up) and, after its initialization, in flash memory 55. In connection with this invention, it is contemplated that the functions carried out by CPU 42 include the control of the various other functions within SOC 40, either by way of commands communicated over the various buses in SOC 40 or by way of control signal lines (not shown in FIG. 4) to those functions.

In this exemplary architecture, CPU 42 is connected to system read-only memory (ROM) 44 and system random access memory (RAM) 46 by way of system bus CPU_BUS. The particular sizes, architectures, and technologies used to realize system ROM 44 and system RAM 46 will depend on the available technology for integrating SOC 40, as well as the desired performance and reliability features. It is contemplated that those skilled in the art having reference to this specification will be readily able to realize these memory functions for each particular installation. Other functions are also resident on system bus CPU_BUS in this exemplary architecture, including standard interface 50 and bus bridge 48.

Standard interface 50 is a conventional interface function that provides the necessary signal conversion, buffering, and other functionality for support of communications between CPU 42 and other residents of system bus CPU_BUS, on one side, and external devices or systems, on the other side. Standard interface 50 is "standard" in the sense that it is preferably constructed and operates according to an industry standard interface protocol. Examples of such interface protocols include the Universal Serial Bus (USB) 1.1 and 2.0 interfaces, the IEEE 1394 (or "Firewire") interface, serial interfaces such as the well-known RS-232 and SCSI interfaces, and the like. In modern implementations of system 60, especially when corresponding to a digital audio player, standard interface 50 will typically follow the USB or IEEE 1394 interface standard. As known in the DAP art, synchronizing of audio files (and, more recently, photographs and other data) between a host computer and the DAP, as well as possibly charging of a battery in the DAP, is typically carried out over a USB 2.0 or IEEE 1394 interface. In the example of FIG. 4, standard interface 50 is a USB 2.0 interface, and as such connects to host system HOST by way of USB connection USB_2.

Bus bridge 48 also resides on system bus CPU_BUS, as mentioned above and as shown in FIG. 4. Bus bridge 48 is a conventional bus interface for coupling system bus CPU_BUS to peripheral bus PER_BUS in this example. Various peripherals outside of SOC 40 reside on peripheral bus PER_BUS, by way of the appropriate external connectors and circuit board conductors. In this example of system 60, corresponding to a DAP, the residents of peripheral bus PER_BUS include SD flash memory interface 51, LCD display 53, various input elements 55 such as keys, buttons, switches, and the like, and audio output interface 57.

According to the preferred embodiment of the invention, standard interface function 47A also resides on peripheral bus PER_BUS. Interface function 47A communicates to interface function 47B, which is realized with or as part of flash memory subsystem controller 49. Standard interface functions 47A, 47B, and subsystem controller 49, are all integrated into SOC 40, according to this embodiment of the invention. To facilitate the construction and design of subsystem controller 49, standard interface 47B may correspond to a conventional Secure Digital (SD) interface as used in conventional flash memory systems (e.g., as shown in FIG. 1), in which case standard interface function 47A is a conventional translator function to translate signals from the SD interface to peripheral bus PER_BUS as shown. In this arrangement, little if any additional circuit design is required to integrate subsystem controller 49 and standard interface 47B into SOC 40. Alternatively, of course, subsystem controller 49 may be constructed so that it directly interfaces with peripheral bus PER_BUS, or further in the alternative so that it directly interfaces with system bus CPU_BUS (thus avoiding the middleman function of bus bridge 48). It is contemplated that these and other architectural variations will be apparent to those skilled in the art having reference to this specification.

Subsystem controller 49, integrated within SOC 40 in this embodiment of the invention, is connected to flash memory interface NAND_IF, to which flash memory 55 is connected (or connectable). The integrated subsystem controller 49 within SOC 40 is also often referred to as an "embedded" controller. Flash memory interface NAND_IF is contemplated to be a conventional flash memory interface bus or structure, and as such includes conductors for carrying an address signal to flash memory 55, one or more chip select control lines, read and write strobe or clock lines, and a bidirectional data bus. In common flash memory arrangements, the address and data signals are time-multiplexed over a common set of lines ("address/data lines"), to save interface circuitry and system board area.

Subsystem controller 49 in this embodiment of the invention preferably performs conventional flash memory control functions, including by way of example controlling the reading of data from and writing of data to the associated flash memory 55 over interface NAND_IF, implementation of error correction coding, mapping of logical addresses (from CPU 42) to physical addresses (in flash memory 55), initializing and maintaining the mapping of defective memory cells in flash memory 55, effecting wear leveling, and the like. As such, subsystem controller 49 is preferably constructed to include logic functionality such as a microcontroller or microprocessor, and its own internal memories (volatile, non-volatile, or both) for storing its executable software instructions as well as system information regarding the mapping and configuration of flash memory 55, as well known in the art. An example of the construction and functionality of typical subsystem controllers as known in the art is described in U.S. Pat. No. 6,426,893, commonly assigned herewith and incorporated hereinto by this reference. It is contemplated that such conventional operation and construction may be utilized in connection with subsystem controller 49 according to this preferred embodiment of the invention, except that, as evident from FIG. 4 and this description, subsystem controller 49 is realized within and integrated into SOC 40. It is contemplated that those skilled in the art having reference to this specification will be readily able to so realize subsystem controller 49 and its functionality according to this exemplary architecture, as well as according to other equivalent architectures as appropriate for a particular system configuration, without undue experimentation.

Optionally, subsystem 49 may be realized according to a multiprocessor architecture, rather than involving a single microprocessor or microcontroller as envisioned in the above-referenced U.S. Pat. No. 6,426,893. For example, a primary CPU may be implemented along with a flash processor of similar construction than the primary CPU (i.e., in a homogeneous multiprocessor environment) or of a different architecture (i.e., in a heterogeneous multiprocessor environment). In either case, the flash processor is provided system resources (memory, etc.) that are dedicated to the management of flash memory 55, including management of all flash access operations, and ancillary functions such as wear leveling, error correction, and the like. The primary CPU can be provided with dedicated resources to serve as an application processor, for executing a host application, managing communications with the host, managing the support environment for subsystem controller 49 in connection with a real-time operating system and file system, and the like. An additional option is to provide a digital signal processor (DSP), either in combination with the application processor and flash processor, or only with the primary CPU, to serve as a slave DSP for carrying out computationally complex operations such as data encryption and decryption and the like.

Flash memory 55 of system 60, according to this embodiment of the invention, corresponds to one or more arrays of flash electrically erasable and programmable read-only memory (EEPROM) cells, arranged within each array to be block-erasable as known in the art, and as such to be rewritable as desired by the implementing system. In this preferred embodiment of the invention, the particular memory technology used for the individual memory cells within the one or more arrays constituting flash memory 55 may be either of the binary or multi-level cell (MLC) type, configured within each array as either NAND or NOR type flash memory. For this particular exemplary implementation, in which system 60 is a DAP, it is contemplated that MLC NAND flash memory technology will be preferred for bulk storage of data that is primarily accessed in a serial manner. The arrangement of the one or more flash memory arrays constituting flash memory 55, according to this embodiment of the invention, as blocks and pages for purposes of writing data, flash erasing data, logical-physical address mapping, and managing wear leveling, may follow any one of a number of such arrangements. Examples of the internal architecture and support circuitry suitable for realization as flash memory 55 in system 60 according to this invention are described in U.S. Pat. Nos. 5,172,338, 5,602,987, 5,315,541, 5,200,959, 5,270,979, 5,428,621, 5,663,901, 5,532,962, 5,430,859, 5,712,180, 6,151,248, 6,222,762, and 6,426,893, all commonly assigned herewith and incorporated hereinto by this reference.

As discussed above, at some point during the manufacture of system 60, it is necessary to initialize flash memory 55 so that it may be used. Flash memory initialization typically involves such functions as formatting flash memory 55 according to a file system, detecting defective memory locations so that they are not mapped for use, generating an initial logical-to-physical address memory map, effecting wear leveling bookkeeping and algorithms. Initialization of subsystem controller 49 itself may also be effected, for example to download its system firmware and operating parameters, trimming local oscillator frequencies, and the like. In addition, depending on the particular application for flash memory 55 and system 60, initializing of flash memory 55 may also include loading executable application software into flash memory 55 for later execution by CPU 42 of system 60, and pre-loading flash memory 55 with application data for this executable application software (e.g., MP3 audio files for system 60 as a DAP).

According to the preferred embodiment of the invention, system 60 permits host system HOST to effect the initialization of flash memory 55 via standard interface 50, which in this case is a USB 2.0 interface. Of course, as mentioned above, this standard interface may alternatively follow a different standard, such as the IEEE 1394 (Firewire) interface. In the manufacturing context, it is contemplated that host system HOST will be manufacturing test equipment, such as commercially available test equipment from Tanisys Technology, or alternative proprietary flash memory test equipment as used by the manufacturer. It is contemplated that this initialization of flash memory 55 may be performed after complete assembly of system 60 (i.e., with peripherals such as display 53, audio output 57, and input elements 55 included), or merely after connection of SOC 40 to flash memory 55 prior to final assembly.

Alternatively, considering that host system HOST is communicating with SOC 40 over a conventional standard interface (e.g., USB 2.0), it is contemplated that host system HOST may be a conventional personal computer or workstation, programmed with the appropriate application to effect flash memory initialization. Further in the alternative, it is contemplated that the flash memory initialization effected by host system HOST need not be performed only during manufacture (i.e., for "initial" initialization of flash memory 55) but may also be performed after system use and deployment, for example to upgrade the executable applications for system 60, stored as "firmware" in flash memory 55, or indeed the firmware system software executable by subsystem controller 49 (which may also be stored in flash memory 55).

Figure 5:
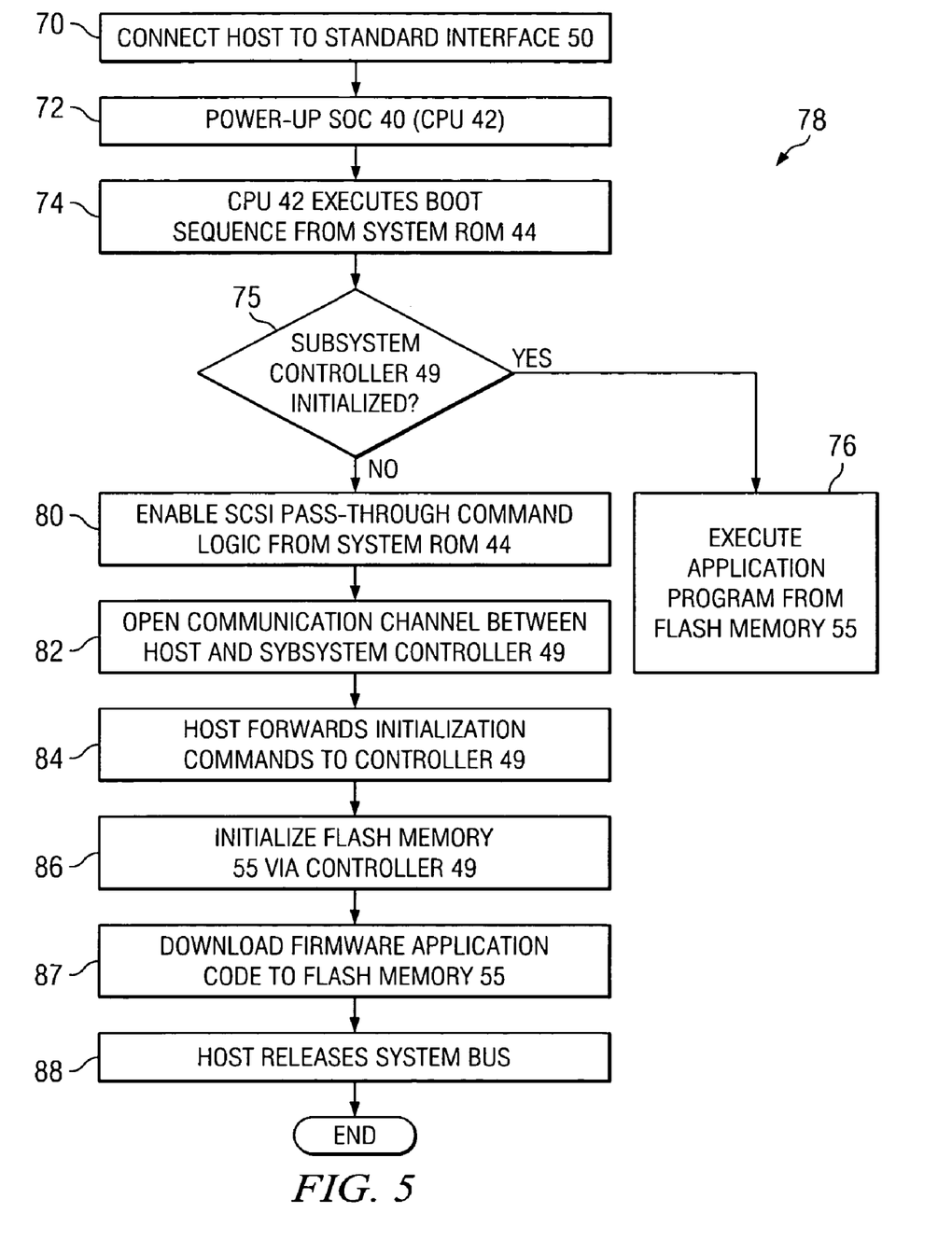
FIG. 5 is a flow diagram illustrating the operation of the system of FIG. 4 in effecting initialization of the flash memory resource according to the preferred embodiment of the invention.

Referring now to FIG. 5, the operation of SOC 40 in combination with host system HOST in effecting the initialization of flash memory 55 according to the preferred embodiment of the invention will now be described in detail. It is assumed, in this example, that SOC 40 is not yet powered-up as this initialization begins. And as mentioned above, the various peripheral devices need not be yet connected to peripheral bus PER_BUS, depending on the particular stage of the manufacture, although one or more peripheral devices may be so connected if desired. Also as this initialization process begins, flash memory 55 is preferably connected to SOC 40 by way of interface NAND_IF, to avoid a stall or wait state later in the process. In process 70, host system HOST is connected to standard interface 50, via bus USB_2 in the example of FIG. 4. Host system HOST is, of course, programmed with the necessary software instructions to effect initialization in the manner described below; it is contemplated that those skilled in the art having reference to this specification can readily derive such initialization programs, and indeed it is contemplated that conventional flash memory initialization programs may be resident in host system HOST, with only minor modification thereto to effect the operations described below.

In process 72, SOC 40, including CPU 42, is powered-up. On power-up, as is conventional for systems such as SOC 40, a boot sequence resident in system ROM 44 is first executed by CPU 42 (process 74 of FIG. 5), in which conventional startup and reset instructions are executed by CPU 42 to begin its operation. According to this preferred embodiment of the invention, the boot sequence stored in system ROM 44 includes an executable instruction, by way of which CPU 42 interrogates flash memory 55 to look for an executable application upon power-up or reset, with conditional instructions following that interrogation operation as will be described below. Accordingly, as part of the executed boot sequence (process 74), CPU 42 executes decision 75 to determine whether an executable application code resides in flash memory 55.

Figure 6:
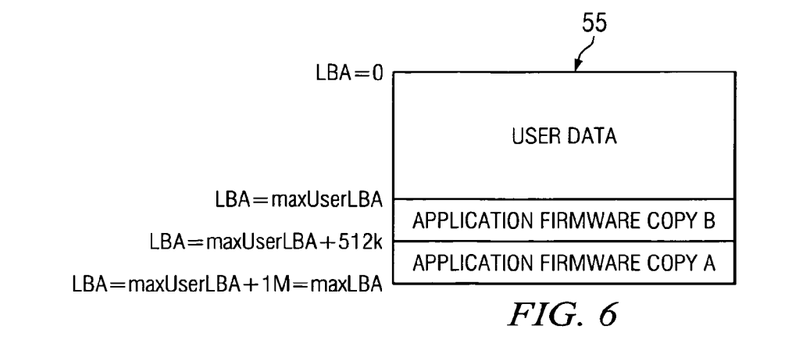
FIG. 6 is a memory map diagram illustrating user and reserved memory space in the flash memory resource of the system of FIG. 4, according to the preferred embodiment of the invention.

FIG. 6 is an exemplary logical memory map of flash memory 55, when initialized, as used in connection with decision 75 according to a preferred embodiment of the invention. As shown, flash memory 55 includes physical capacity that corresponds to a logical memory space extending from a logical block address (LBA) of 0000 to a maximum LBA value maxLBA. This logical memory space is primarily devoted to user data, which is assigned the memory space from an LBA of 0000 to a maximum LBA maxUserLBA. In this example, the topmost 1 Mattes of memory space in flash memory 55 is reserved for application firmware program storage, extending from an LBA of maxUserLBA to maximum LBA value maxLBA, which is equal to the address maxUserLBA+1 M. Preferably, the memory space above LBA value maxUserLBA will not be accessible to the user, with accesses thereto blocked by subsystem controller 49. As shown in FIG. 6, according to this preferred embodiment of the invention, two copies of the application firmware are stored in this uppermost portion of the flash memory space after initialization of flash memory 55. Application firmware copy A resides in flash memory 55 in the memory space between LBA value maxUserLBA+512 k and LBA value maxLBA; application firmware copy B resides in the memory space between LBA value maxUserLBA and LBA value maxUserLBA+512 k. According to this embodiment of the invention, firmware copies A and B are intended to be identical, serving as redundant copies of the application firmware.

According to the preferred embodiment of the invention, CPU 42 executes the boot sequence from system ROM 44 by interrogating flash memory 55 above LBA addresses maxUserLBA. If the space between LBA maxUserLBA and maxLBA contains a valid copy of the application firmware, either of copy A or copy B, decision 76 is YES, and the application firmware will be executed in process 76. Normal system operation of SOC 40 and system 60 (to the extent peripherals are present) then commences according to the application program that was found in process 74. The validity of the application firmware is determined by evaluation of a conventional cyclic redundancy checksum (CRC) value for each copy; if one copy is valid and the other is corrupt, the valid copy is preferably copied to the other copy's location in flash memory 55 for redundancy On the other hand, if the memory space between LBA maxUserLBA and maxLBA is blank, or does not contain a valid copy of the application firmware (e.g., the CRC fails for both copies), decision 75 returns a NO result, indicating that no application firmware is present. This will, of course, be the case prior to initialization of flash memory 55.

Alternatively to decision 75 determining whether application programs are present in flash memory 55, and particularly in a maintenance or firmware upgrade operation, it is contemplated that decision 75 may be based on a different criteria, considering that, in such a case, the application program will already reside in flash memory 55. As known in the art, firmware upgrade of systems can be effected by way of a special combination of keys being pressed on startup, or the like, generally in combination with power cycling of the system.

According to this preferred embodiment of the invention, in response to a NO result from decision 75 or such other criteria being met, CPU 42 executes sequence of instructions from system ROM 44 corresponding to process 80, in which certain "pass-through" command logic is enabled, so that commands that are received by SOC 40 over standard interface 50 "pass-through" to subsystem controller 49 for execution. In this example, these pass-through commands are in the form of SCSI (Small Computer Serial Interface) extension commands that direct CPU 42 to format requests received over standard interface 50 for execution by subsystem controller 49, by way of a low-level flash memory device driver. In effect, the pass-through command logic is a piece of glue logic code, executed by CPU 42, that interface between its SCSI command interpreter and that low-level device driver.

Alternatively, this initialization sequence can be downloaded from host system HOST to system RAM 46, and then executed by CPU 42 to interrogate flash memory 55 to determine the presence of application firmware, and to then establish the communications channel. Further in the alternative, the instructions by way of which CPU 42 interrogates flash memory 55 to determine its initialization state may be present in system ROM, with the remainder of the initialization sequence then downloaded from host system HOST into system RAM 46 if initialization is necessary. It is contemplated that these and other combinations of downloaded or resident initialization sequence code will be apparent to those skilled in the art having reference to this specification, with the particular adaptation selected for specific applications.

Figure 7:
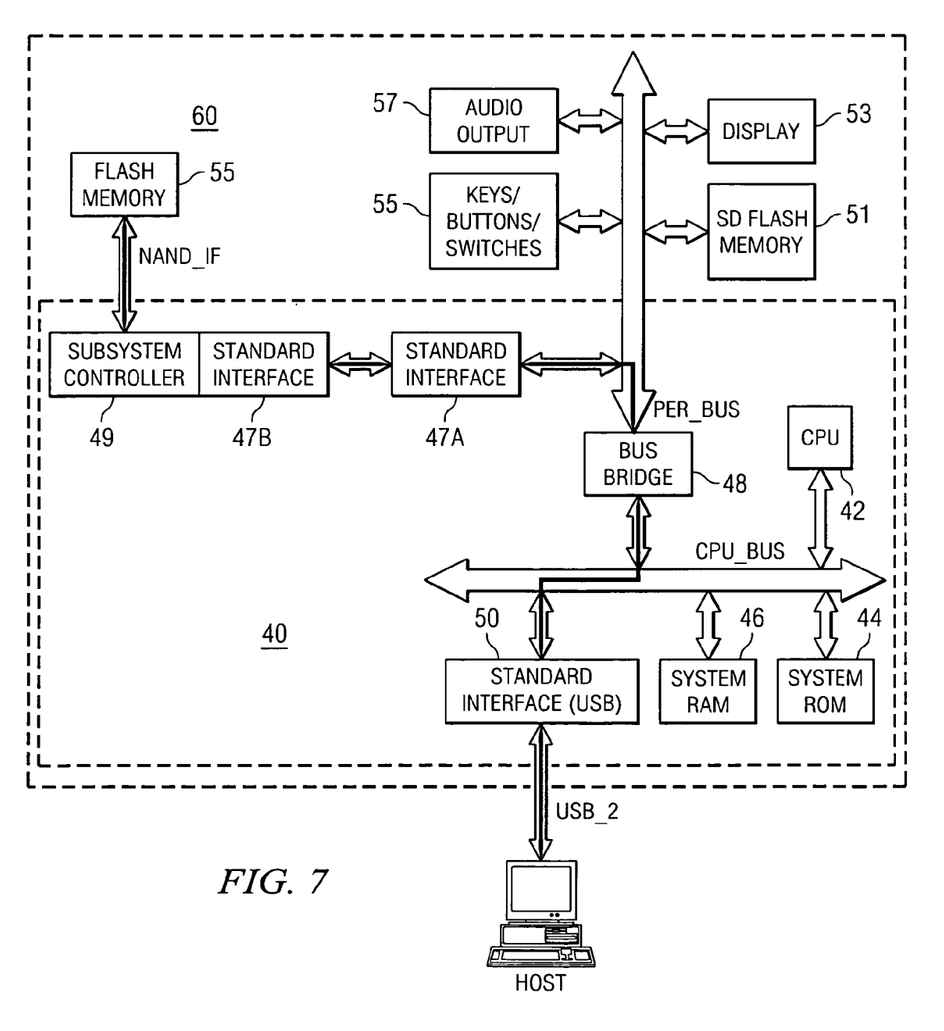
FIG. 7 is an electrical diagram, in block form, of the system of FIG. 4 illustrating the opening of a communications channel through the system-on-a-chip between a host system and the flash memory resource and subsystem controller, according to the preferred embodiment of the invention.

Upon CPU 42 enabling the SCSI pass-through command logic, a communication channel is opened between host system HOST and subsystem controller 49, in process 82. This communication channel is contemplated to be similar as that utilized by system 60, when arranged as a DAP, to effect "synchronization" of music files between a host computer and flash memory. In effect, it is contemplated that CPU 42 effectively establishes a direct communications path between host system HOST and subsystem controller 49 in process 82, so that commands and data are forwarded over this path without requiring substantial execution by CPU 42. FIG. 7 illustrates this communications channel between host system HOST and flash memory 55, as established by CPU 42 in SOC 40 in process 82 according to this preferred embodiment of the invention.

Of course, the extent of the involvement by CPU 42 in this operation will depend upon the particular architecture of SOC 40. However, it is preferred that this communications channel will permit communication between host system HOST and subsystem controller 49 for initialization of flash memory 55 in a manner that is similar to the communication between conventional test equipment and conventional flash memory systems, during initialization, as described above relative to FIG. 2; this arrangement permits the initialization hardware and software of host system HOST to be similar to that already realized in conventional flash memory manufacturing equipment and processing.

Following opening of the communications channel in process 82, host system HOST forwards initialization commands and data to subsystem controller 49 over the channel (FIG. 7), in process 84. As known in the art, these initialization commands include the necessary diagnostic instructions and the like that cause subsystem controller 49 to access system memory locations of flash memory 55 that are not otherwise accessible in normal operation.

For example, where the communications channel is effected by way of the SCSI pass-through command extensions mentioned above, the pass-through commands to be interpreted by CPU 42 are quite limited:

For all media types:
Check Media Card Type (Command Code D0h) (to check for SD/MMC or CF Media types)
For SD/MMC Media:
Media Card SD Execute Command (Command Code D1h)
Media Card SD Host Control Command (Command Code D2h)
For CF Media:
Media Card CF Send Command (Command Code D1h)
Media Card CF Data Command (Command Code D2h)
Media Card CF Status Command (Command Code D3h)

The Check Media Card Type command interrogates subsystem controller 49 to identify the media type of flash memory 55, and also enables and disables SOC 40 from executing the pass-through commands (i.e., when disabled, command codes D1h etc. are not interpreted as pass-through commands).

When enabled, for the example of SD/MMC media, upon host system HOST issuing the Media Card SD Execute command (D1h), CPU 42 issues a corresponding native command to subsystem controller 49. The Execute command from host system HOST may include arguments including the direction of data transfer (to flash memory 55 or from flash memory 55), the type of command, arguments that qualify the commands, and the like. Upon receiving the Execute command, CPU 42 sends a corresponding native command to subsystem controller 49, and serves as a buffer for data transfer between host system HOST and the flash memory subsystem. The Media Card SD Host Control Command can be used to indicate certain attributes such as the frequency of operation to the flash memory subsystem, and to indicate wait states, block lengths, and other control attributes to the host. For the example of CF media, the Send Command indicates the particular sector, cylinder, and device locations of flash memory 55 to be accessed by a subsequent Data command, which is forwarded by CPU 42 to subsystem controller 49 as a native command for sending data from host system HOST to flash memory 55 or sending data from flash memory 55 to host system HOST. The CF Status command is simply a command issued by host system HOST to retrieve status information from the status registers of subsystem controller 49.

As mentioned above in the Background of the Invention relative to U.S. Pat. No. 6,009,496, conventional microcontroller architectures involve the on-board microprocessor to execute a reprogramming control routine in programming embedded flash memory. The pass-through commands and command logic used according to this embodiment of the invention are especially beneficial relative to that conventional approach, as these commands minimize the role of CPU 42 in effecting control of the flash memory subsystem, instead allowing host system HOST to effect such control. In addition, the relatively small command set reduces the overhead for CPU 42, and permits extension of the commands to new memory card types.

According to this embodiment of the invention, a sequence of these pass-through commands as issued by host system HOST initializes flash memory 55 via subsystem controller 49, in process 86. As known in the art and as described above, initialization process 86 includes such operations as formatting flash memory 55 according to the desired file system and structure, detecting and mapping defective memory locations, establishing logical-to-physical address mapping structures and the mapping itself, and providing subsystem controller 49 with the appropriate wear-leveling algorithms to ensure maximum useful life of the memory cells in flash memory 55. System firmware, operating parameters, local oscillator frequencies, and the like may also be initialized within subsystem controller 49 itself at this point. In addition, also as mentioned above, it is contemplated that initialization of flash memory 55 will also include the loading of application software into flash memory 55 (e.g., as redundant copies A and B loaded into the memory space above LBA address maxUserLBA in the example of FIG. 6) for use by CPU 42 in its system operation, and perhaps also the pre-loading of application data (e.g., MP3 audio files, JPEG photo files, etc., for system 60 arranged as a DAP) into flash memory 55. Such loading and pre-loading of program code and data will, of course, follow the formatting and other system initialization of flash memory 55 as described above.

Following completion of initialization process 86, and perhaps such functional testing and data verification of flash memory 55, the operation of host system HOST in such initialization is complete. Host system HOST then disables the pass-through command functionality by issuing a Check Media Card Type command (D0h), and releases system bus CPU_BUS, in process 88. The operation of SOC 40, and system 60 to the extent desired or possible (depending on the presence of the peripheral functions), can then continue as desired. In the initialization context, for example during manufacture of SOC 40 or system 60, CPU 42 may simply enter an idle or off state. If the initialization corresponds to a firmware update or other maintenance operation, CPU 42 may instead reset or reboot, and begin execution of the application programs from flash memory 55 (i.e., decision 75 is YES) according to its normal operation. It is contemplated that those skilled in the art having reference to this specification will readily effect the next sequence of operations as desired.

As mentioned above, various alternatives to the architecture and methodology described above are suitable for use as and in connection with this invention. For example, the particular architecture of the system-on-a-chip or other large scale system integration including flash memory controller circuitry can vary widely, depending upon the particular application. For example, the bus structure and interface arrangement of the preferred embodiment of the invention can take any number of alternative forms, as desired by the system designer. Similarly, the particular application of such an integrated system can also take any one of a large number of forms beyond the exemplary DAP described above, including such systems as general purpose or special purpose computing systems, portable audio and video players and recorders, wireless (or wired) telephone handsets and systems, portable special purpose systems such as used for inventory or delivery control, to name a few. And the particular tasks involved in initialization of the flash memory resource can include more or fewer (or indeed, completely different) tasks from those described above in connection with the preferred embodiment of the invention. It is contemplated that those skilled in the art having reference to this specification will readily recognize that these and other alternatives are within the scope of this invention as claimed.

According to the preferred embodiment of the invention, flash memory resources can become useful as disk replacement and other non-volatile bulk storage, of program and data, in highly integrated digital systems that utilize system-on-a-chip architecture, without incurring the substantial cost of providing special interface and test equipment for initialization of the flash memory. Rather, according to this invention, conventional host computers or test equipment can communicate with integrated flash memory subsystem controllers, using conventional standard interface technology already provided by the system-on-a-chip to efficiently and readily initialize the flash memory resource. Development time and manufacturing expense are minimized as a result of this invention, while providing a great deal of flexibility in the construction, operation, and management of the eventual systems.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of initializing a non-volatile memory subsystem of a digital system, the method comprising the steps of:
    performing an initialization sequence of the non-volatile memory subsystem of the digital system, wherein the digital system comprises a system-on-a-chip ("SOC") integrated circuit comprising a central processing unit, an embedded non-volatile memory subsystem controller that is distinct from the central processing unit, and an external interface, the initialization sequence including a command to open a communications channel between the external interface of the SOC integrated circuit and the embedded non-volatile memory subsystem controller of the SOC integrated circuit that is distinct from the central processing unit of the SOC integrated circuit;
    powering up the central processing unit of the SOC integrated circuit;
    executing, with the central processing unit, at least one boot sequence instruction stored in a system read-only memory to interrogate one or more non-volatile memory arrays in the digital system to detect whether an application program is resident;
    downloading one or more initialization instructions over the external interface in response to determining that an application program is not resident in the one or more non-volatile memory arrays; and
    executing the downloaded one or more initialization instructions to initialize the one or more non-volatile memory arrays in the digital system according to initialization instructions applied to the external interface and communicated over the communications channel to the embedded non-volatile memory subsystem controller.

2. The method of claim 1, wherein downloading one or more initialization instructions comprises:
    storing the one or more initialization instructions in a system random access memory; and
    wherein performing an initialization sequence of the non-volatile memory subsystem comprises:
        retrieving the one or more initialization instructions from the system random access memory; and
        executing the retrieved one or more initialization instructions.

3. The method of claim 1, further comprising:
    responsive to determining that an application program is resident in the one or more non-volatile memory arrays, executing the application program with the central processing unit.

4. The method of claim 1, wherein performing the initialization sequence comprises:
    operating the central processing unit of the SOC integrated circuit to execute one or more initialization instructions stored in a system program memory.

5. The method of claim 1, wherein initializing one or more non-volatile memory arrays comprises:
    formatting the one or more non-volatile memory rays according to a file system.

6. The method of claim 5, wherein initiating one more non-volatile memory arrays comprises:
    loading, into the one or more non-volatile memory arrays, an application software program executable by the central processing unit of the SOC integrated circuit.

7. The method of claim 6, wherein initializing one or more non-volatile memory arrays further comprises:
    pre-loading, into the one or more non-volatile memory arrays, application data.

8. The method of claim 1, wherein initializing one or more non-volatile memory arrays comprises:
    updating system firmware for the embedded non-volatile memory subsystem controller.

9. The method of claim 1, wherein the one or more non-volatile memory arrays comprise one or more flash memory arrays.

10. The method of claim 1, further comprising:
    connecting a host system to an external interface;
    wherein the initializing step is performed by the host system over the external interface.

11. A digital system, comprising:
    a system-on-a-chip ("SOC") integrated circuit, comprising:
        a central processing unit; and
        a memory subsystem controller;
    one or more non-volatile memory arrays coupled to the memory subsystem controller;
    system read-only memory coupled to the central processing unit, wherein the system read-only memory stores boot sequence instructions executable by the central processing unit, the boot sequence instructions comprising instructions for interrogating the one or more non-volatile memory arrays to determine whether an application program is resident in the one or more non-volatile memory arrays and instructions for downloading executable instructions from over an external interface responsive to determining that an application program is not resident in the one or more non-volatile memory arrays;

wherein the central processing unit is programmed to interrogate the one or more non-volatile memory arrays based on the boot sequence instructions stored in the system read-only memory to determine whether an application program is resident in the one or more non-volatile memory arrays, and to execute initialization instructions responsive to determining that an application program is not resident in the one or more non-volatile memory arrays, the initialization instructions to initialize the one or more non-volatile memory arrays.

12. The digital system of claim 11, wherein the SOC integrated circuit further comprises an external interface; and wherein the central processing unit is also programmed to download the initialization instructions from over the external interface responsive to determining that an application program is not resident in the one or mare non-volatile memory arrays.

13. The digital system of claim 12, further comprising:

system random access memory, coupled to the central processing unit, for storing the downloaded executable instructions.

14. The digital system of claim 13, wherein the downloaded executable instructions comprise a sequence of one or more instructions, executable by the central processing unit for opening a communications channel between the external interface and the memory subsystem controller.

15. The digital system of claim 11, wherein the central processing unit is also programmed to retrieve the initialization instructions from the system read-only memory responsive to determining that an application program is not resident in the one or more non-volatile memory arrays.

16. The digital system of claim 11, wherein the SOC integrated circuit further comprises an external interface; and wherein the external interface is constructed according to an industry standard interface protocol.

17. The digital system of claim 11, wherein the one or more non-volatile memory arrays comprise one or more flash memory arrays.

18. The digital system of claim 17, wherein the SOC integrated circuit further comprises;

a system bus coupling the memory subsystem controller to the central processing unit; and interface circuitry for coupling the system bus to an interface of the memory subsystem controller, the interface of the memory subsystem controller corresponding to a standard flash memory interface.

19. The digital system of claim 11, further comprising:

at least one peripheral function coupled to the SOC integrated circuit.

20. The digital system of claim 19, wherein the at least one peripheral function comprises:

an audio output interface.

21. The digital system of claim 19, wherein the at least one peripheral function comprises:

a user input element; and a display.

* * * * *

UNITED STATES PATENT AND TRADEMARK OFFICE
CERTIFICATE OF CORRECTION

PATENT NO. : 7,640,424 B2  Page 1 of 1
APPLICATION NO. : 11/250094
DATED : December 29, 2009
INVENTOR(S) : Kevin M. Conley It is certified that error appears in the above-identified patent and that said Letters Patent is hereby corrected as shown below:

<u>On the Title Page</u>

Item (75), after "San Jose," replace "TX" with --CA--.

<u>In the Claims</u>

In column 14, claim 5, line 31, after "non-volatile memory" replace "rays" with --arrays--.

In column 14, claim 6, line 33, after "wherein" replace "initiating" with --initializing--.

In column 15, claim 12, line 20, after "in the one or" replace "mare" with --more--.

In column 15, claim 14, line 28, immediately after "processing unit" insert --,--.

In column 16, claim 18, line 14, immediately after "further comprises" replace ";" with --:--.

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,640,424 B2  
APPLICATION NO. : 11/250094  
DATED : December 29, 2009  
INVENTOR(S) : Kevin M. Conley Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 540 days.

Signed and Sealed this

Ninth Day of November, 2010

David J. Kappos  
*Director of the United States Patent and Trademark Office*